US012020914B2

(12) United States Patent
Yamazaki et al.

(10) Patent No.: US 12,020,914 B2
(45) Date of Patent: Jun. 25, 2024

(54) OPTIMIZING PLASMA RESOURCES FOR TARGETED FILM

(71) Applicant: Tokyo Electron Limited, Tokyo (JP)

(72) Inventors: Shota Yamazaki, Yamanashi (JP); Yuichi Takenaga, Yamanashi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 918 days.

(21) Appl. No.: 17/075,869

(22) Filed: Oct. 21, 2020

(65) Prior Publication Data

US 2021/0134570 A1 May 6, 2021

(30) Foreign Application Priority Data

Nov. 1, 2019 (JP) ................................ 2019-200139

(51) Int. Cl.
*H01J 37/32* (2006.01)
*C23C 16/455* (2006.01)
(Continued)

(52) U.S. Cl.
CPC .. *H01J 37/32926* (2013.01); *C23C 16/45536* (2013.01); *C23C 16/45544* (2013.01);
(Continued)

(58) Field of Classification Search
None
See application file for complete search history.

(56) References Cited

U.S. PATENT DOCUMENTS 7,295,307 B2 * 11/2007 Naka .................. G01N 21/9501 356/32
7,327,444 B2 * 2/2008 Naka ...................... G01N 21/65 356/73
(Continued)

FOREIGN PATENT DOCUMENTS

CN 1556914 A * 12/2004 ............. G01B 11/02
CN 1808056 B * 9/2011 ............. G01B 11/06
JP 2008-091826 A 4/2008

OTHER PUBLICATIONS

Hussein et al., "Optimization of plasma-enhanced chemical vapor deposition silicon oxynitride layers for integrated optics applications", Apr. 2006, Thin Solid Films 515 (2007) 3779-3786. (Year: 2006).*
(Continued)

*Primary Examiner* — Mohammad Ali
*Assistant Examiner* — Kelvin Booker
(74) *Attorney, Agent, or Firm* — Venjuris, P.C.

(57) ABSTRACT

An information processing device includes a storage configured to store a first film thickness model or a first refractive index model defining an amount of change in a film thickness or a refractive index at each position of a first wafer when a film forming processing is performed by changing an output of each of a plurality of plasma sources provided in a film forming device by a predetermined amount and a calculator configured to calculate, based on the first film thickness model or the first refractive index model, a correction value of the output of each of the plurality of plasma sources to achieve a target value of a film thickness or a target value of a refractive index at each position of a second wafer.

10 Claims, 17 Drawing Sheets

(51) Int. Cl.
*C23C 16/52* (2006.01)
*G05B 19/41* (2006.01)
*G05B 19/4155* (2006.01)
*H01L 21/67* (2006.01)

(52) U.S. Cl.
CPC .......... *C23C 16/52* (2013.01); *G05B 19/4155* (2013.01); *H01L 21/67253* (2013.01); *G05B 2219/45031* (2013.01); *H01J 2237/332* (2013.01)

(56) References Cited

U.S. PATENT DOCUMENTS

| | | | | |
|---|---|---|---|---|
| 8,734,536 | B2 * | 5/2014 | Beck | G01J 3/0232 29/25.01 |
| 11,740,183 | B2 * | 8/2023 | Schleifer | G01J 3/44 356/301 |
| 2001/0025691 | A1 * | 10/2001 | Kanno | H01J 37/321 257/E21.252 |
| 2006/0038980 | A1 * | 2/2006 | Naka | H01L 22/12 356/73 |
| 2008/0086228 | A1 * | 4/2008 | Yamaji | G05B 13/021 700/109 |
| 2009/0214963 | A1 * | 8/2009 | Tadokoro | H01L 22/20 430/30 |
| 2010/0198386 | A1 * | 8/2010 | Yamaji | H01L 22/12 700/110 |
| 2011/0114951 | A1 * | 5/2011 | Kamikubo | H01L 22/12 257/E23.179 |
| 2012/0018829 | A1 * | 1/2012 | Beck | G01J 3/0218 257/431 |
| 2014/0231945 | A1 * | 8/2014 | Beck | H01L 31/0322 257/431 |
| 2019/0314954 | A1 * | 10/2019 | Heo | B24B 37/22 |
| 2021/0223179 | A1 * | 7/2021 | Hollander | G01J 3/027 |
| 2022/0244685 | A1 * | 8/2022 | Noda | G05B 23/0235 |

OTHER PUBLICATIONS

Gamsky et al., "Infrared Reflection Absorption Spectroscopy of Photoresist Films on Silicon Wafers: Measuring Film Thickness and Removing Interference Fringes", Apr. 1994, Anal. Chem. 1994, 66, 1015-1020. (Year: 1994).*

Inushima et al., "Film Growth Mechanism of Photo-Chemical Vapor Deposition", Mar. 1988, Appl. Phys. A 47, 229536. (Year: 1988).*

Kuzel et al., "Gouy shift correction for highly accurate refractive index retrieval in time-domain terahertz spectroscopy", Apr. 2010, 2010 Optical Society of America. (Year: 2010).*

Martinez et al., "Model-Based Run-to-Run Controllers for Improved Yields", Dec. 2006, IEEE Control Systems Magazine. (Year: 2006).*

Elsaeedya et al., "The pivotal role of TiO2 layer thickness in optimizing the performance of TiO2/P—Si solar cell", Dec. 2020, Journal of Alloys and Compounds 867 (2021) 159150. (Year: 2020).*

* cited by examiner

| PROCESS CONDITION | | | | | | | | | | | |
|---|---|---|---|---|---|---|---|---|---|---|---|
| TYPES OF PROCESS DATA | PRESSURE [Pa] | PLASMA FLOW RATE [sccm] | OUTPUT OF PLASMA SOURCE #1 [W] | OUTPUT OF PLASMA SOURCE #2 [W] | OUTPUT OF PLASMA SOURCE #3 [W] | OUTPUT OF PLASMA SOURCE #4 [W] | OUTPUT OF PLASMA SOURCE #5 [W] | OUTPUT OF PLASMA SOURCE #6 [W] | OUTPUT OF PLASMA SOURCE #7 [W] | TEMPERA-TURE [deg-C] | FILM FORMING TIME [sec] |
| PROCESS DATA | $v$ | $f$ | $p_1$ | $p_2$ | $p_3$ | $p_4$ | $p_5$ | $p_6$ | $p_7$ | $T$ | $t$ |

| PROCESS CONDITION | | | | | | | | | | | |
|---|---|---|---|---|---|---|---|---|---|---|---|
| TYPES OF PROCESS DATA | PRE-SSURE [Pa] | PLASMA FLOW RATE [sccm] | OUTPUT OF PLASMA SOURCE #1 [W] | OUTPUT OF PLASMA SOURCE #2 [W] | OUTPUT OF PLASMA SOURCE #3 [W] | OUTPUT OF PLASMA SOURCE #4 [W] | OUTPUT OF PLASMA SOURCE #5 [W] | OUTPUT OF PLASMA SOURCE #6 [W] | OUTPUT OF PLASMA SOURCE #7 [W] | TEMPERA-TURE [deg-C] | FILM FORMING TIME [sec] |
| PROCESS DATA (INITIAL) | $v$ | $f$ | $p_1$ | $p_2$ | $p_3$ | $p_4$ | $p_5$ | $p_6$ | $p_7$ | $T$ | $t$ |
| PROCESS DATA (OPTIMIZED) | $v$ | $f$ | $p_1 + \Delta p_1$ | $p_2 + \Delta p_2$ | $p_3 + \Delta p_3$ | $p_4 + \Delta p_4$ | $p_5 + \Delta p_5$ | $p_6 + \Delta p_6$ | $p_7 + \Delta p_7$ | $T$ | $t$ |

1510

INITIAL FILM THICKNESS DISTRIBUTION

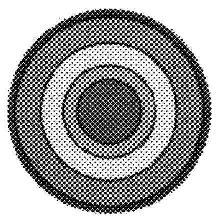

1520

PREDICTED FILM THICKNESS DISTRIBUTION AFTER OPTIMIZATION

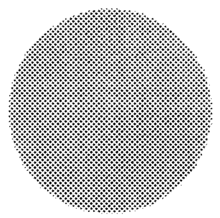

1530

ACTUAL FILM THICKNESS DISTRIBUTION AFTER OPTIMIZATION

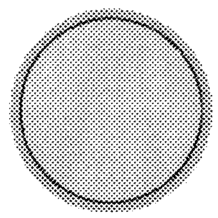

OPTIMIZING PLASMA RESOURCES FOR TARGETED FILM

CROSS-REFERENCE TO RELATED APPLICATIONS

This application is based on and claims priority from Japanese Patent Application No. 2019-200139 filed on Nov. 1, 2019 with the Japan Patent Office, the disclosure of which is incorporated herein in its entirety by reference.

TECHNICAL FIELD

The present disclosure relates to an information processing device, an information processing method, a storage medium storing an information processing program, and a semiconductor manufacturing device.

BACKGROUND

Generally, when a new recipe is generated to achieve a desired film thickness (or refractive index) in a film forming device, an operator adjusts process conditions of the film forming device while sequentially checking the surface states (film thickness and refractive index) of a wafer to perform a film forming processing, thereby promoting optimization of the process conditions.

In a case of a film forming device having a plurality of plasma sources, operations of optimizing the outputs of all of the plasma sources are highly burdensome for the operator, and these operations largely depend on the know-how of the operator. See, e.g., Japanese Patent Laid-Open Publication No. 2008-091826.

SUMMARY

According to an aspect, an information processing device includes a storage configured to store a first film thickness model or a first refractive index model defining an amount of change in a film thickness or a refractive index at each position of a first wafer when a film forming processing is performed by changing an output of each of a plurality of plasma sources provided in a film forming device by a predetermined amount and a calculator configured to calculate, based on the first film thickness model or the first refractive index model, a correction value of the output of each plasma source to achieve a target value of a film thickness or a target value of a refractive index at each position of a second wafer.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

FIG. 7 is a first diagram illustrating a specific example of a processing performed by the model generator in the model generation processing;

FIGS. 15A and 15B are diagrams illustrating the result of a film forming processing according to a new recipe.

DESCRIPTION OF EMBODIMENT

Figure 1:
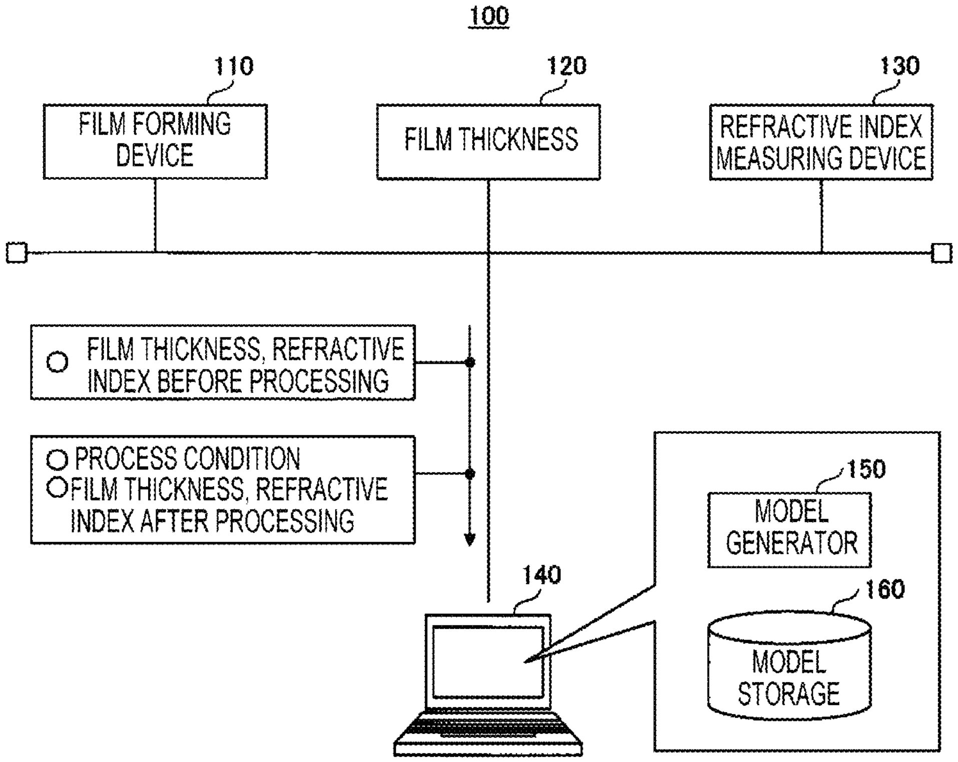
FIG. 1 is a diagram illustrating an example of a system configuration of a film forming system in a phase of generating a film thickness model or a refractive index model.

In the following detailed description, reference is made to the accompanying drawings, which form a part hereof. The illustrative embodiments described in the detailed description, drawing, and claims are not meant to be limiting. Other embodiments may be utilized, and other changes may be made without departing from the spirit or scope of the subject matter presented here.

Hereinafter, each embodiment will be described with reference to the accompanying drawings. In addition, in the present specification and the drawings, components having substantially the same functional configuration will be designated by the same reference numerals to omit duplicate descriptions thereof.

First Embodiment

<System Configuration of Film Forming System>

First, a system configuration of a film forming system according to a first embodiment will be described. In the film forming system according to the first embodiment, a plurality of processings are divided into and executed in two phases. Specifically, the processings are divided into and executed in a phase of generating a film thickness model or a refractive index model and a phase of optimizing the output of each plasma source to generate a new recipe using the generated film thickness model or refractive index model.

Thus, in the following, descriptions will be made respectively as to:

a system configuration of a film forming system in a phase of generating a film thickness model or a refractive index model; and a system configuration of the film forming system in a phase of optimizing the output of each plasma source to generate a new recipe using the generated film thickness model or refractive index model.

(1) System Configuration of Film Forming System in Phase of Generating Film Thickness Model or Refractive Index Model First, a system configuration of a film forming system in a phase of generating a film thickness model or a refractive index model will be described. FIG. 1 is a diagram illustrating an example of a system configuration of a film forming system in a phase of generating a film thickness model or a refractive index model. As illustrated in FIG. 1, the film forming system 100 includes a film forming device 110, a film thickness measuring device 120, a refractive index measuring device 130, and an information processing device 140.

The film forming device 110 is a single-wafer film forming device having a plurality of plasma sources. The film forming device 110 performs a film forming processing on a wafer under predetermined process conditions. Further, the film forming device 110 notifies the information processing device 140 of the process conditions used when the film forming processing is performed.

The film thickness measuring device 120 measures the film thickness at each position of the wafer before the film forming processing and the film thickness at each position of the wafer after the film forming processing, respectively. Further, the film thickness measuring device 120 notifies the information processing device 140 of the film thicknesses at each position measured respectively before and after the film forming processing.

The refractive index measuring device 130 measures the refractive index (the value relating to the ratio of the nitrogen component in a film) at each position of the wafer before the film forming processing and the refractive index at each position of the wafer after the film forming processing. Further, the refractive index measuring device 130 notifies the information processing device 140 of the refractive indices at each position measured respectively before and after the film forming processing.

A model generation program is installed in the information processing device 140, and the information processing device 140 functions as a model generator 150 when the model generation program is executed.

The model generator 150 acquires the film thickness and the refractive index before the film forming processing and the film thickness and the refractive index after the film forming processing, notified from the film thickness measuring device 120 and the refractive index measuring device 130, and the processing conditions used when the film forming processing is performed, notified from the film forming device 110.

Further, the model generator 150 generates a film thickness model defining the amount of change in the film thickness at each position of the wafer when the film forming processing is performed under the process conditions in which the output of each of the plasma sources is changed by a predetermined amount.

Further, the model generator 150 generates a refractive index model defining the amount of change in the refractive index at each position of the wafer when the film forming processing is performed under the process conditions in which the output of each of the plasma sources is changed by a predetermined amount.

Moreover, the model generator 150 stores the generated film thickness model and the generated refractive index model in a model storage 160, which is an example of a storage.

Figure 2:
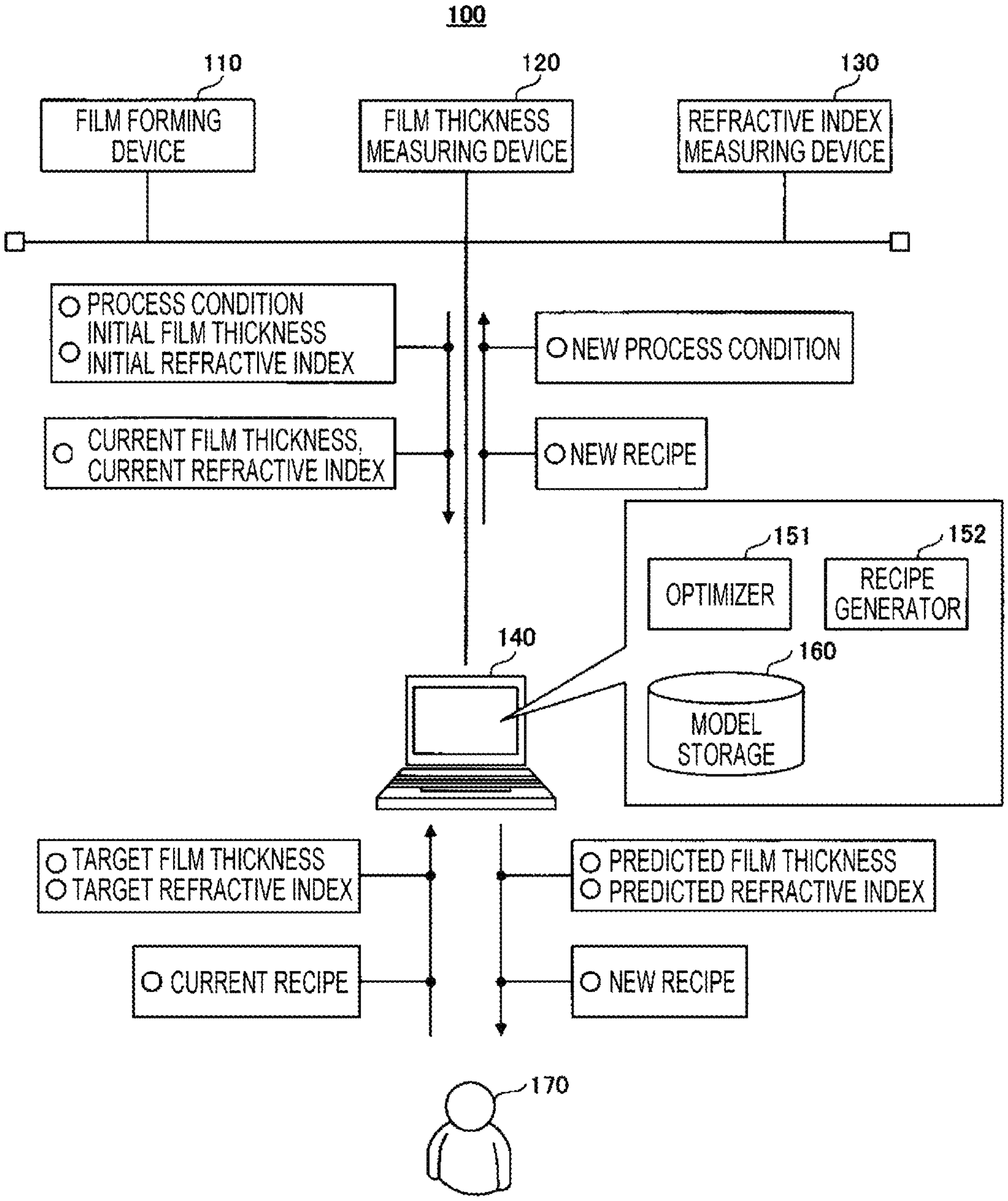
FIG. 2 is a diagram illustrating an example of a system configuration of the film forming system in a phase of optimizing the output of each plasma source to generate a new recipe.

(2) System Configuration of Film Forming System in Phase of Optimizing Output of Each Plasma Source to Generate New Recipe Next, a system configuration of the film forming system in a phase of optimizing the output of each plasma source using the generated film thickness model or refractive index model to generate a new recipe will be described. FIG. 2 is a diagram illustrating an example of a system configuration of the film forming system in a phase of optimizing the output of each plasma source to generate a new recipe. Here, the differences from FIG. 1 will be mainly described.

The film forming device 110 first performs a film forming processing on the wafer under predetermined process conditions included in a current recipe, and notifies the information processing device 140 of the process conditions used when the film forming processing is performed. Subsequently, when new process conditions are notified, the film forming device 110 performs a film forming processing on the wafer under the new process conditions.

The film thickness measuring device 120 measures the film thickness at each position of the wafer after the film forming processing is performed on the wafer under the predetermined process conditions included in the current recipe, and notifies the information processing device 140 of the measured film thickness as an initial film thickness. Further, the film thickness measuring device 120 measures the film thickness at each position of the wafer after the film forming processing is performed on the wafer under the new process conditions, and notifies the information processing device 140 of the measured film thickness as a current film thickness.

The refractive index measuring device 130 measures the refractive index at each position of the wafer after the film forming processing is performed on the wafer under the predetermined process conditions included in the current recipe, and notifies the information processing device 140 of the measured refractive index as an initial refractive index. Further, the refractive index measuring device 130 measures the refractive index at each position of the wafer after the film forming processing is performed on the wafer under the new process conditions, and notifies the information processing device 140 of the measured refractive index as a current refractive index.

An optimization program and a recipe generation program are installed in the information processing device 140, and the information processing device 140 functions as an optimizer 151 and a recipe generator 152 when the optimization program and the recipe generation program are executed.

The optimizer 151 is an example of a calculator, and receives a target value of the film thickness (target film thickness) for new recipe generation from an operator 170 and calculates a residual (film thickness residual) from the initial film thickness. Further, the optimizer 151 calculates the amount of change (correction value) of the output of each of the plasma sources using the calculated film thickness residual and the film thickness model stored in the model storage 160.

Further, the optimizer 151 notifies the film forming device 110 of the new process conditions (process conditions to which the calculated correction value of the output of each of the plasma sources is applied). Further, the optimizer 151 calculates the film thickness residual between the target film thickness and the current film thickness after the film forming processing is performed on the wafer under the new process conditions. The optimizer 151 calculates the correction value so that (the actual value of) the film thickness residual is as small as possible, and notifies the recipe generator 152 of the correction value of the output of each of the plasma sources when it is determined that (the actual value of) the film thickness residual is sufficiently small.

Moreover, the optimizer 151 calculates the calculated film thickness at each position of the wafer when the film forming processing is performed under the new process conditions as a predicted film thickness.

Similarly, the optimizer 151 receives a target value of the refractive index (target refractive index) for new recipe generation from the operator 170, and calculates a residual (refractive index residual) from the initial refractive index. Further, the optimizer 151 calculates the amount of change (correction value) of the output of each of the plasma sources using the calculated refractive index residual and the refractive index model stored in the model storage 160.

Further, the optimizer 151 notifies the film forming device 110 of the new process conditions (process conditions to which the calculated correction value of the output of each of the plasma sources is applied). Further, the optimizer 151 calculates the refractive index residual between the target refractive index and the current refractive index after the film forming processing is performed under the new process conditions. The optimizer 151 calculates the correction value so that (the actual value of) the refractive index residual is as small as possible, and notifies the recipe generator 152 of the correction value of the output of each of the plasma sources when it is determined that (the actual value of) the refractive index residual is sufficiently small.

Moreover, the optimizer 151 calculates the calculated refractive index at each position of the wafer when the film forming processing is performed under the new process conditions as a predicted refractive index.

The recipe generator 152 is an example of a generator, and receives the current recipe from the operator 170. Further, the recipe generator 152 modifies the current recipe and generates a new recipe when the optimizer 151 notifies the correction value of the output of each of the plasma sources. The recipe generator 152 displays the generated new recipe to the operator 170 and notifies the film forming device 110 of the generated new recipe.

<Internal Configuration of Film Forming Device>

Figure 3A:
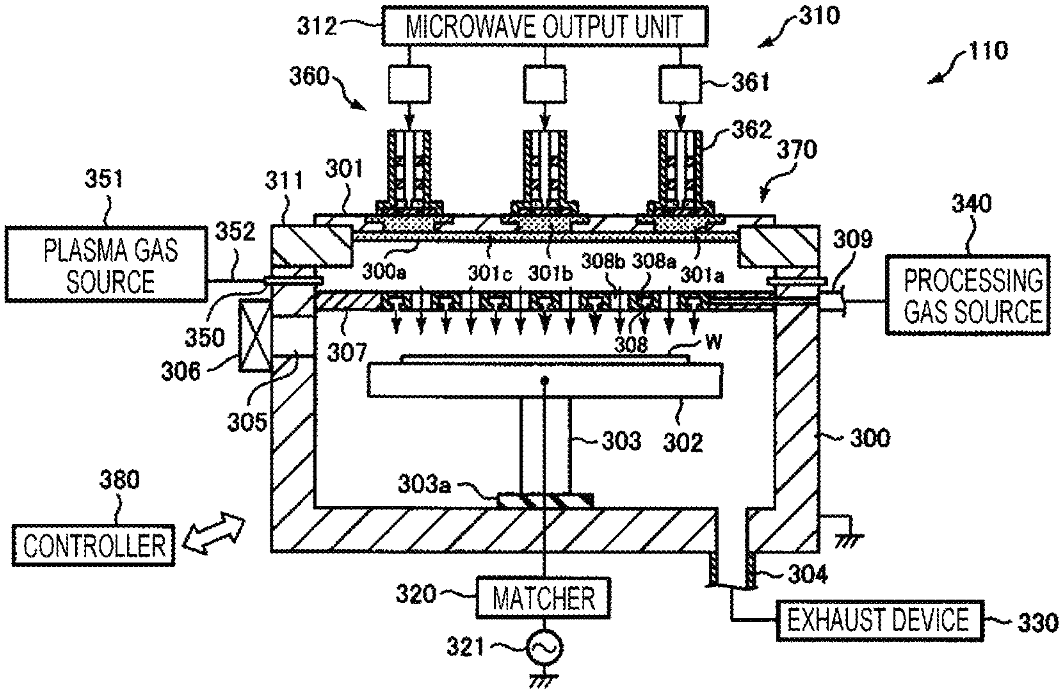
FIGS. 3A and 3B are diagrams illustrating an example of an internal configuration of a film forming device having a plurality of plasma sources.

Next, an internal configuration of the film forming device 110 having a plurality of plasma sources will be described. FIG. 3A is a diagram illustrating an example of an internal configuration of a film forming device having a plurality of plasma sources.

As illustrated in FIG. 3A, the film forming device 110 includes a substantially cylindrical grounded chamber 300 made of an air-tightly configured metal material such as aluminum or stainless steel and a microwave plasma source 310 for forming a microwave plasma in the chamber 300.

An opening 300*a* is formed in the top of the chamber 300, and the microwave plasma source 310 is provided in the opening 300*a* so as to face the inside of the chamber 300 via a disk-shaped lid body 301. The lid body 301 is made of a metal such as aluminum, and is supported by a support ring 311 provided on the top of the chamber 300, and the space between the support ring 311 and the lid body 301 is sealed air-tightly by a seal ring (not illustrated).

A susceptor 302 is provided in the chamber 300 to horizontally support a wafer W in a state of being supported by a tubular support member 303 erected in the center of the bottom of the chamber 300 via an insulating member 303*a*. A material constituting the susceptor 302 and the support member 303 may be, for example, aluminum having an alumite-treated (anodized) surface.

Further, although not illustrated, the susceptor 302 is provided with, for example, an electrostatic chuck for electrostatically adsorbing the wafer W, a temperature control mechanism, a gas flow path through which a heat transfer gas is supplied to the back surface of the wafer W, and elevating pins which move up and down to transfer the wafer W. Moreover, a high frequency bias power supply 321 is electrically connected to the susceptor 302 via a matcher 320. By supplying high-frequency power from the high frequency bias power supply 321 to the susceptor 302, ions in the plasma are drawn to the wafer W side.

An exhaust pipe 304 is connected to the bottom of the chamber 300, and an exhaust device 330 including a vacuum pump is connected to the exhaust pipe 304. Then, the inside of the chamber 300 is exhausted by operating the exhaust device 330, which enables the inside of the chamber 300 to be depressurized to a predetermined degree of vacuum at a high speed. Further, the sidewall of the chamber 300 is provided with a carry-in/carry-out opening 305 for performing the carry-in and carry-out of the wafer W and a gate valve 306 which opens and closes the carry-in/carry-out opening 305.

A shower plate 307 is horizontally provided at a position above the susceptor 302 in the chamber 300 to discharge a processing gas toward the wafer W. The shower plate 307 has a gas flow path 308 formed in a grid pattern and a large number of gas discharge holes 308*a* formed in the gas flow path 308, and a space 308*b* is defined between the gas flow path 308 in a grid pattern. A pipe 309 is connected to the gas flow path 308 of the shower plate 307 to extend out of the chamber 300. Further, a processing gas source 340 is connected to the pipe 309, and the shower plate 307, the pipe 309, and the processing gas source 340 constitute a gas supply mechanism for the processing gas.

Meanwhile, a ring-shaped plasma gas introduction member 350 is provided along the chamber wall at a position above the shower plate 307 of the chamber 300, and a large number of gas discharge holes are formed in the inner circumference of the plasma gas introduction member 350. A plasma gas source 351 is connected to the plasma gas introduction member 350 via a pipe 352 to supply a plasma gas, and the plasma gas introduction member 350, the pipe 352, and the plasma gas source 351 constitute a gas supply mechanism for the plasma gas. For example, Ar gas is appropriately used as the plasma gas.

The plasma gas introduced into the chamber 300 from the plasma gas introduction member 350 is plasmarized by microwaves introduced into the chamber 300 from the microwave plasma source 310. The plasmarized plasma gas passes through the space 308*b* of the shower plate 307 and excites the processing gas discharged from the gas discharge holes 308*a* of the shower plate 307 to form a plasma of the processing gas. Here, the plasma gas and the processing gas may be supplied by the same supply member. Further, the processing gas may have the function of the plasma gas.

The microwave plasma source 310 includes a microwave output unit 312 which distributes microwaves into a plurality of paths and outputs the distributed microwaves and a microwave supply 360 which transmits the microwaves output from the microwave output unit 312 for radiating the microwaves into the chamber 300.

The microwave supply 360 includes a plurality of amplifiers 361 which mainly amplify the microwaves and a plurality of microwave radiation mechanisms 362 which guide the microwaves amplified by the respective amplifiers 361 into the chamber 300 respectively.

A hole 301*a* is formed in a portion of the lid body 301 corresponding to the microwave radiation mechanism 362, and a dielectric member 301*b* is fitted into the hole 301*a* and functions as a microwave transmission window that transmits microwaves therethrough, the dielectric member 301*b* forming a part of the microwave radiation mechanism 362. Thus, a top wall 370 of the chamber 300 is formed by the lid body 301 and the dielectric member 301*b*. Further, a thin dielectric plate 301*c* is provided on the lower surface of the top wall 370 so as to cover the top wall 370 including the arrangement region of the microwave radiation mechanism 362. The dielectric plate 301*c* is configured as a single plate which covers both the dielectric member 301*b* and the lid body 301.

Figure 3B:
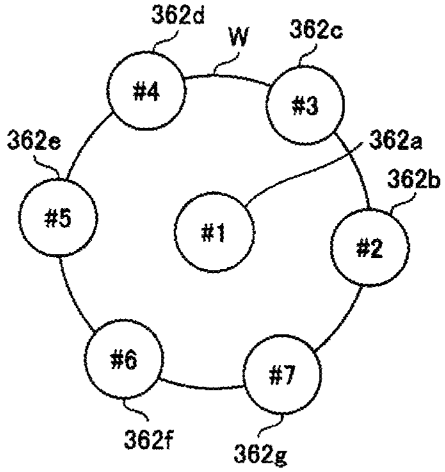

In the first embodiment, the microwave supply 360 has seven amplifiers 361 and seven microwave radiation mechanisms 362 (plasma sources) (see microwave radiation mechanisms 362*a* to 362*g* in FIG. 3B). In addition, FIG. 3B is a diagram illustrating the arrangement of the microwave radiation mechanisms 362*a* to 362*g* as viewed from above.

As illustrated in FIG. 3B, six ones of the microwave radiation mechanisms 362*a* to 362*g* are arranged in a circumferential shape and the other one is arranged in the center with respect to the wafer W horizontally supported on the susceptor 302.

In addition, as illustrated in FIG. 3B, in the following description of the present embodiment, the microwave radiation mechanism 362*a* is referred to as "plasma source #1," the microwave radiation mechanism 362*b* is referred to as "plasma source #2," and the microwave radiation mechanism 362*c* is referred to as "plasma source #3." Further, the microwave radiation mechanism 362*d* is referred to as "plasma source #4," the microwave radiation mechanism 362*e* is referred to as "plasma source #5," the microwave radiation mechanism 362*f* is referred to as "plasma source #6," and the microwave radiation mechanism 362*g* is referred to as "plasma source #7."

Returning to the description of FIG. 3A, each component of the film forming device 110 illustrated in FIG. 3A is controlled by a controller 380 having a microprocessor. The controller 380 includes, for example, a memory that stores therein a recipe set in the film forming device 110, an operating unit, and a display, and controls each component of the film forming device 110 according to the set recipe.

<Hardware Configuration of Information Processing Device>

Figure 4:
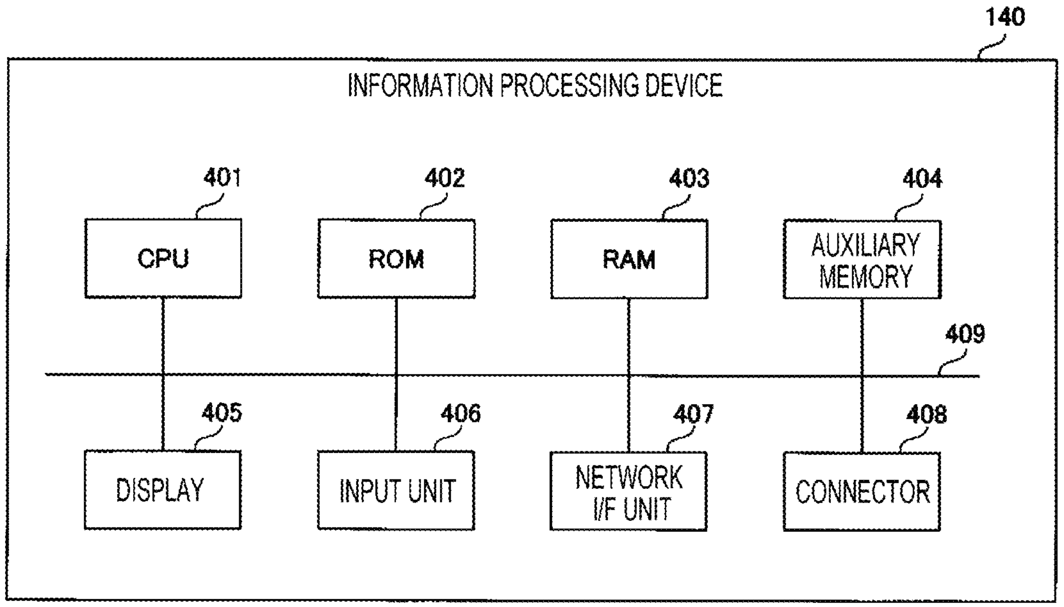
FIG. 4 is a diagram illustrating an example of a hardware configuration of an information processing device.

Next, a hardware configuration of the information processing device 140 will be described. FIG. 4 is a diagram illustrating an example of a hardware configuration of an information processing device. As illustrated in FIG. 4, the information processing device 140 includes a central processing unit (CPU) 401, a read only memory (ROM) 402, and a random access memory (RAM) 403. The CPU 401, the ROM 402, and the RAM 403 form a so-called computer.

Further, the information processing device 140 includes an auxiliary memory 404, a display 405, an input unit 406, a network interface (I/F) unit 407, and a connector 408. In addition, respective hardwares of the information processing device 140 are connected to each other via a bus 409.

The CPU 401 is a device that executes various programs (e.g., information processing programs such as a model generation program, an optimization program, and a recipe generation program) installed in the auxiliary memory 404.

The ROM 402 is a non-volatile memory. The ROM 402 functions as a main memory device that stores various programs or data necessary for the CPU 401 to execute various programs installed in the auxiliary memory 404. Specifically, the ROM 402 stores booting programs such as a basic input/output system (BIOS) or an extensible firmware interface (EFI).

The RAM 403 is a volatile memory such as a dynamic random access memory (DRAM) or a static random access memory (SRAM). The RAM 403 functions as a main memory device that provides an operation area which is expanded when various programs installed in the auxiliary memory 404 are executed by the CPU 401.

The auxiliary memory 404 is an auxiliary memory device that stores various programs or information used when various programs are executed. The model storage 160 is achieved in the auxiliary memory 404.

The display 405 is a display device that displays a screen generated when various programs are executed (e.g., a screen including the predicted film thickness, the predicted refractive index, and the new recipe). The input unit 406 is an input device by which the operator 170 inputs various instructions (e.g., the target film thickness, the target refractive index, and the current recipe) to the information processing device 140.

The network I/F unit 407 is a communication device which is connected to an external network (not illustrated). The connector 408 is a connection device for connection with various devices such as the film forming device 110, the film thickness measuring device 120, and the refractive index measuring device 130.

<Functional Configuration of Model Generator>

Figure 5:
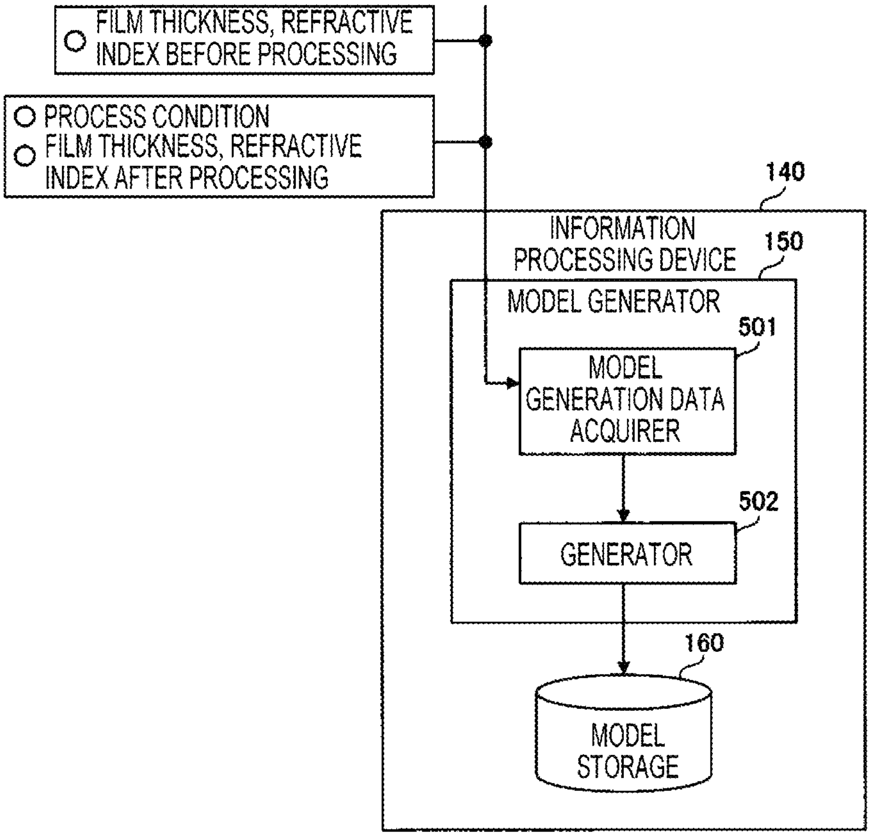
FIG. 5 is a diagram illustrating an example of a functional configuration of a model generator.

Next, the model generator 150 of the information processing device 140 will be described in detail. FIG. 5 is a diagram illustrating an example of a functional configuration of a model generator.

As illustrated in FIG. 5, the model generator 150 includes a model generation data acquirer 501 and a generator 502.

The model generation data acquirer 501 acquires various data when the film forming device 110 performs a film forming processing on a wafer (a first wafer which is a processing target at the time of a model generation processing) for generation of the film thickness model and the refractive index model. In the first embodiment, the film forming processing for generation of the film thickness model and the refractive index model refers to a film forming processing performed in a first processing procedure. Here, the first processing procedure refers to, for example, a processing procedure of changing the output of each of the plasma sources #1 to #7 by a predetermined amount in a state where the process conditions other than the outputs of the plasma sources #1 to #7 are fixed.

However, the film forming processing for generation of the film thickness model and the refractive index model is not limited to the film forming processing performed in the first processing procedure. For example, the film forming processing may be performed in a second processing procedure in which the outputs of the plasma sources #1 to #7 are changed at the same time by using an experimental design method (orthogonal array). Alternatively, in a case where the film thickness model and the refractive index model are generated by other methods (e.g., Partial Least Squares (PLS) or Deep Learning (DL)), the film forming processing may be performed in other processing procedures suitable for the other methods. In addition, hereinafter, for simplicity of description, the film forming processing for generation of the film thickness model and the refractive index model will be described as being performed in the first processing procedure.

The model generation data acquirer 501 acquires, from the film forming device 110, the outputs of the plasma sources #1 to #7 (outputs after change by a predetermined amount) along with the process conditions other than the outputs of the plasma sources #1 to #7.

Further, the model generation data acquirer 501 acquires, from the film thickness measuring device 120, the film thickness at each position of the wafer before the film forming processing and the film thickness at each position of the wafer after the film forming processing when the film forming processing for generation of the film thickness model is performed.

Further, the model generation data acquirer 501 acquires, from the refractive index measuring device 130, the refractive index at each position of the wafer before the film forming processing and the refractive index at each position of the wafer after the film forming processing when the film forming processing for generation of the refractive index model is performed.

The generator 502 generates the film thickness model by calculating the amount of change in the film thickness per unit amount (e.g., 1 W) from the amount of change in the film thickness at each position of the wafer when the film forming processing for generation of the film thickness model is performed.

Further, the generator 502 generates the refractive index model by calculating the amount of change in the refractive index per unit amount (e.g., 1 W) from the amount of change in the refractive index at each position of the wafer when the film forming processing for generation of the refractive index model is performed.

Moreover, the generator 502 stores the generated film thickness model and the generated refractive index model in the model storage 160.

<Flow of Model Generation Processing>

Figure 6:
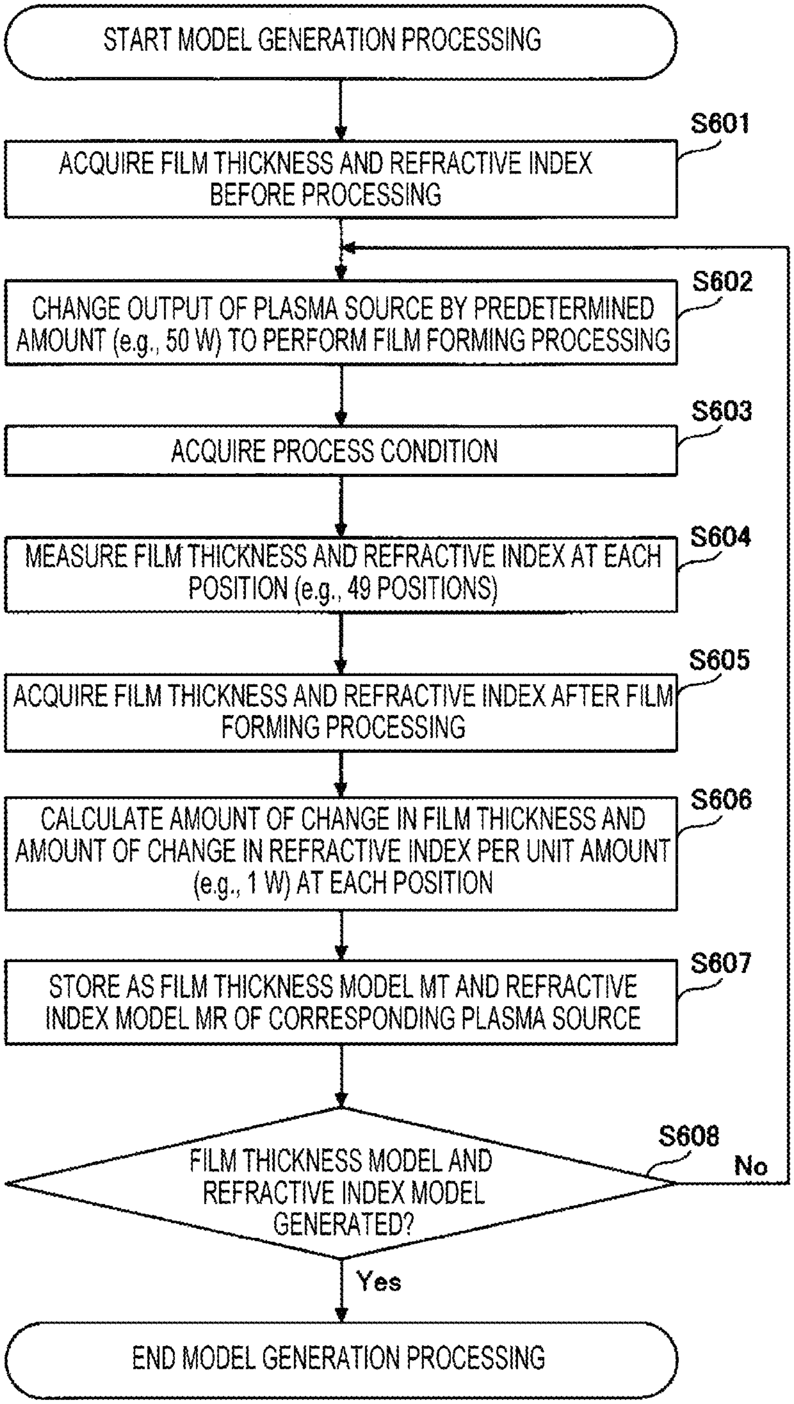
FIG. 6 is an example of a flowchart illustrating a flow of a model generation processing of generating the film thickness model and the refractive index model.

Next, a flow of a model generation processing executed when the film forming processing for generation of the film thickness model and the refractive index model is performed in the film forming system 100 will be described. FIG. 6 is an example of a flowchart illustrating a flow of a model generation processing of generating the film thickness model and the refractive index model.

In step S601, the model generation data acquirer 501 of the information processing device 140 acquires, from the film thickness measuring device 120 and the refractive index measuring device 130, the film thickness and the refractive index at each position of the wafer before the film forming processing for generation of the film thickness model and the refractive index model is performed. In addition, it is assumed that the number of respective positions of the wafer from which the model generation data acquirer 501 acquires the film thickness and the refractive index is, for example, 49.

In step S602, the film forming device 110 changes the output of one plasma source (e.g., the plasma source #1) among the plasma sources #1 to #7 from a default value by a predetermined amount (e.g., 50 W) to perform a film forming processing.

In step S603, the model generation data acquirer 501 of the information processing device 140 acquires the process conditions used when the film forming processing is performed in step S602 from the film forming device 110.

In step S604, the film thickness measuring device 120 and the refractive index measuring device 130 measure the film thickness and the refractive index at each position of the wafer after the film forming processing.

In step S605, the model generation data acquirer 501 of the information processing device 140 acquires, from the film thickness measuring device 120 and the refractive index measuring device 130, the film thickness and the refractive index at each position of the wafer after the film forming processing.

In step S606, the generator 502 of the information processing device 140 calculates the amount of change in the film thickness and the amount of change in the refractive index per unit amount (e.g., 1 W) at each position of the wafer.

In step S607, the generator 502 of the information processing device 140 stores the calculated amount of change in the film thickness in the model storage 160 as one of a film thickness model $M_T$. Further, the generator 502 of the information processing device 140 stores the calculated amount of change in the refractive index in the model storage 160 as one of the refractive index model $M_R$.

In step S608, the generator 502 of the information processing device 140 determines whether or not the film thickness model and the refractive index model have been completely generated. In step S608, when it is determined in step S608 that the film thickness model and the refractive index model have not been completely generated (if No in step S608), the processing returns to step S602. On the other hand, when it is determined in step S608 that the film thickness model and the refractive index model have been completely generated, the model generation processing ends.

<Specific Example of Model Generation Processing>

Next, a specific example of a model generation processing by the film forming system 100 will be described with reference to FIGS. 7 and 8. FIG. 7 is a first diagram illustrating a specific example of a model generation processing, and is a diagram illustrating a specific example of the process conditions used when the film forming processing for generation of the film thickness model is performed, the process conditions being acquired from the film forming device 110 by the model generation data acquirer 501.

As illustrated in FIG. 7, the process conditions 700 include "the types of process data" and "process data" as information items. "The types of process data" include, for example, the pressure in the chamber 300, the flow rate of a plasma gas supplied from plasma gas source 351, the output of each of the plasma sources #1 to #7, the temperature in the chamber 300, and the film forming time. In addition, the values corresponding to "the types of process data" are stored in "process data". In addition, for simplicity of description, only some of the process conditions other than the outputs of the plasma sources #1 to #7 are described in the process conditions 700.

As described above, in the film forming processing for generation of the film thickness model and the refractive index model, among the process conditions 700, the process data of each of the types of process data (="the output of the plasma source #1"~"the output of the plasma source #7") is changed by a predetermined amount (e.g., 50 W).

Figure 8:
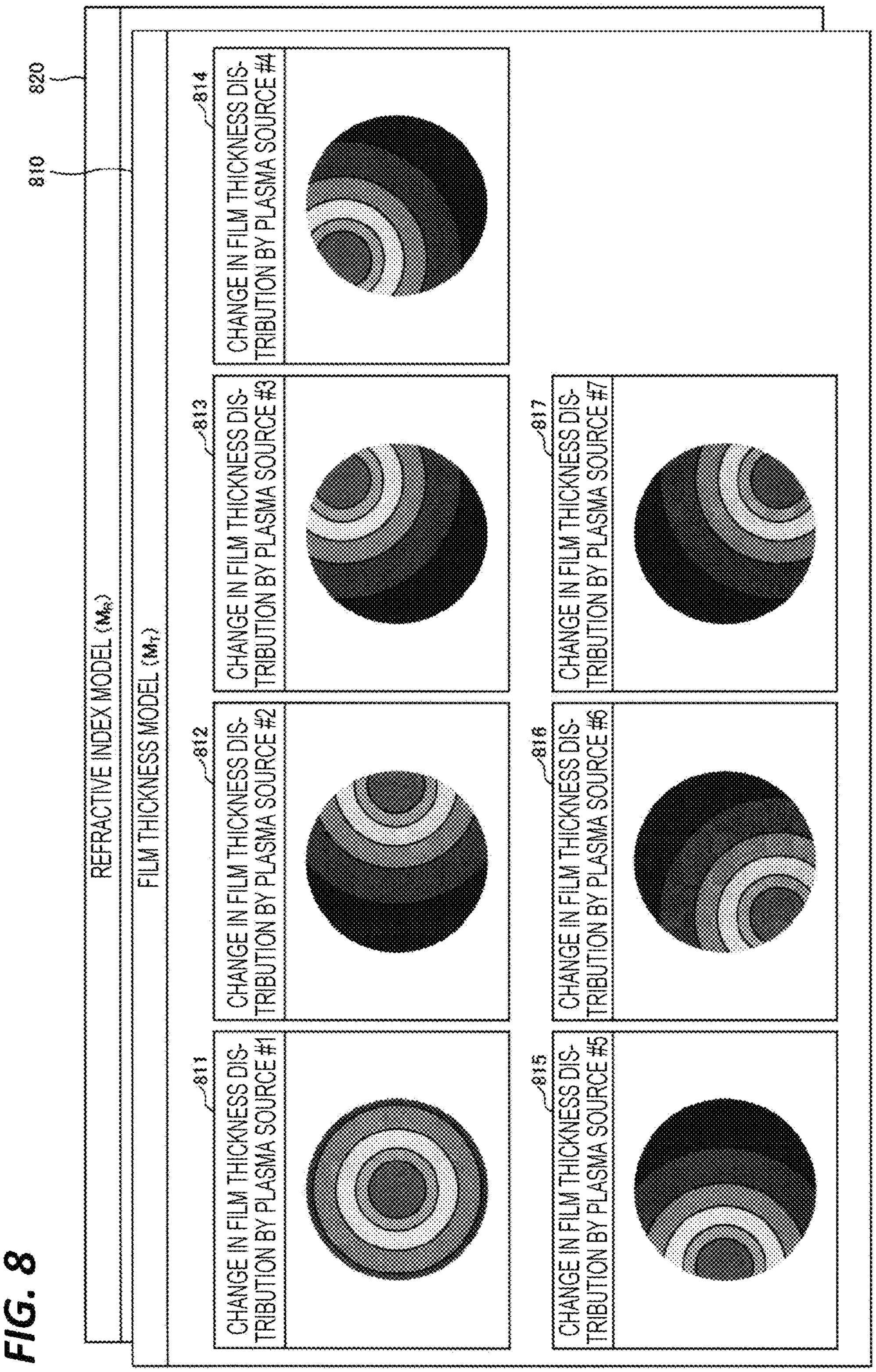
FIG. 8 is a second diagram illustrating the specific example of the processing performed by the model generator in the model generation processing.

FIG. 8 is a second diagram illustrating the specific example of the model generation processing, and is a diagram illustrating a specific example of a film thickness model $M_T$; 810 and a refractive index model $M_R$; 820.

Reference numeral 811 of the film thickness model $M_T$; 810 visualizes, as a color map, the calculation result (change in the film thickness distribution) obtained by calculating the amount of change per unit amount from the amount of change in the film thickness at each position of the wafer when the film forming processing is performed by changing the output of the plasma source #1 by a predetermined amount.

Similarly, reference numeral 812 visualizes, as a color map, the calculation result (change in the film thickness distribution) obtained by calculating the amount of change per unit amount from the amount of change in the film thickness at each position of the wafer when the film forming processing is performed by changing the output of the plasma source #2 by a predetermined amount.

Similarly, reference numeral 813 visualizes, as a color map, the calculation result (change in the film thickness distribution) obtained by calculating the amount of change per unit amount from the amount of change in the film thickness at each position of the wafer when the film forming processing is performed by changing the output of the plasma source #3 by a predetermined amount.

Similarly, reference numeral 814 visualizes, as a color map, the calculation result (change in the film thickness distribution) obtained by calculating the amount of change per unit amount from the amount of change in the film thickness at each position of the wafer when the film forming processing is performed by changing the output of the plasma source #4 by a predetermined amount.

Similarly, reference numeral 815 visualizes, as a color map, the calculation result (change in the film thickness distribution) obtained by calculating the amount of change per unit amount from the amount of change in the film thickness at each position of the wafer when the film forming processing is performed by changing the output of the plasma source #5 by a predetermined amount.

Similarly, reference numeral 816 visualizes, as a color map, the calculation result (change in the film thickness distribution) obtained by calculating the amount of change per unit amount from the amount of change in the film thickness at each position of the wafer when the film forming processing is performed by changing the output of the plasma source #6 by a predetermined amount.

Similarly, reference numeral 817 visualizes, as a color map, the calculation result (change in the film thickness distribution) obtained by calculating the amount of change per unit amount from the amount of change in the film thickness at each position of the wafer when the film forming processing is performed by changing the output of the plasma source #7 by a predetermined amount.

In this way, the model generator 150 generates the film thickness model $M_T$; 810 including the calculation results (reference numerals 811 to 817) provided in the number depending on the number of plasma sources #1 to #7 when the film forming processing for generation of the film thickness model is performed. Similarly, the model generator 150 generates the refractive index model $M_R$; 820 including the calculation result provided in the number depending on the number of plasma sources #1 to #7 when the film forming processing for generation of the refractive index model is performed. In addition, when the film forming processing for generation of the film thickness model and the refractive index model is performed by the second processing procedure, the plasma sources #1 to #7 are classified into a plurality of zones. Therefore, the film thickness model $M_T$ and the refractive index model $M_R$ including the calculation results provided in the number depending on the number of zones are generated.

<Functional Configuration of Optimizer and Recipe Generator>

Figure 9:
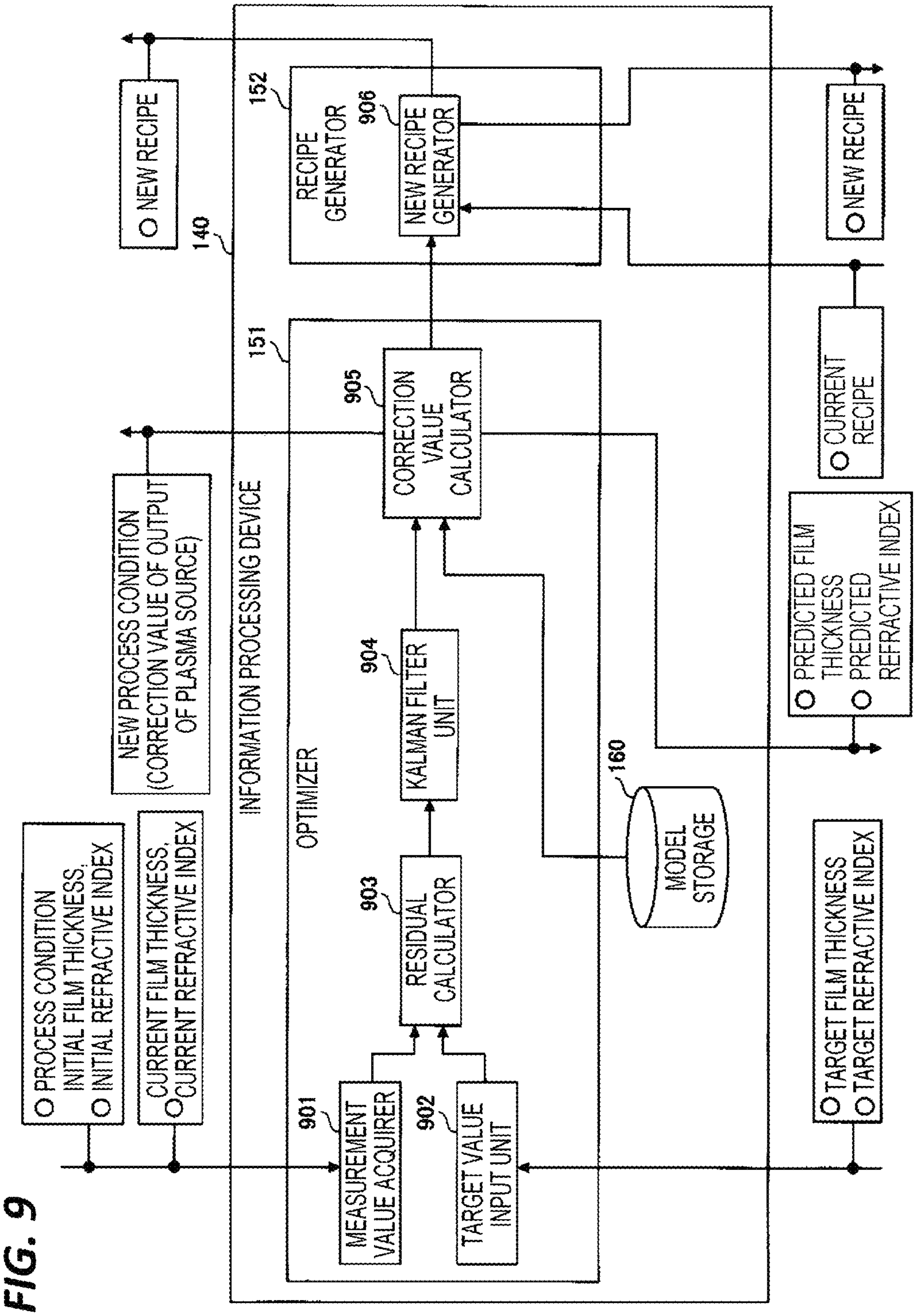
FIG. 9 is a diagram illustrating an example of a functional configuration of an optimizer and a recipe generator.

Next, a functional configuration of the optimizer 151 and the recipe generator 152 of the information processing device 140 will be described. FIG. 9 is a diagram illustrating an example of a functional configuration of an optimizer and a recipe generator.

As illustrated in FIG. 9, the optimizer 151 includes a measurement value acquirer 901, a target value input unit 902, a residual calculator 903, a Kalman filter unit 904, and a correction value calculator 905.

The measurement value acquirer 901 acquires the process conditions used when a film forming processing is performed according to a current recipe from the film forming device 110. Further, the measurement value acquirer 901 acquires, as an initial film thickness and an initial refractive index, the film thickness and the refractive index at each position of a wafer (a second wafer as a processing target at the time of a new recipe generation processing) after the film forming processing is performed according to the current recipe from the film thickness measuring device 120 and the refractive index measuring device 130.

Further, the measurement value acquirer 901 acquires, as a current film thickness and a current refractive index, the film thickness and the refractive index at each position of the wafer after a film forming processing is performed by the film forming device 110 under new process conditions (process conditions to which correction values of the outputs of the plasma sources are applied).

The target value input unit 902 receives the input of a target film thickness and a target refractive index from the operator 170.

The residual calculator 903 calculates a film thickness residual, which is the difference between the initial film thickness and the target film thickness or the difference between the current film thickness and the target film thickness. Further, the residual calculator 903 calculates a refractive index residual, which is the difference between the initial refractive index and the target refractive index or the difference between the current refractive index and the target refractive index.

The Kalman filter unit 904 estimates the actual values of the film thickness residual and the refractive index residual calculated by the residual calculator 903 by adjusting the Kalman gain. In addition, it is assumed that the measurement results when the film thickness measuring device 120 and the refractive index measuring device 130 measure the film thickness and the refractive index at each position of the wafer include measurement errors.

The correction value calculator 905 acquires the actual value of the film thickness residual and the actual value of the refractive index residual estimated by the Kalman filter unit 904 and the film thickness model $M_T$; 810 and the refractive index model $M_R$; 820 stored in the model storage 160. Further, the correction value calculator 905 calculates the correction values of the outputs of the plasma sources #1 to #7 based on the acquired actual value of the film thickness residual and the acquired actual value of the refractive index residual as well as the film thickness model $M_T$; 810 and the refractive index model $M_R$; 820. Further, the correction value calculator 905 notifies the film forming device 110 of the new process conditions to which the calculated correction values of the outputs of the plasma sources #1 to #7 are applied.

Further, the correction value calculator 905 calculates the correction values such that the actual value of the film thickness residual and the actual value of the refractive index residual are as small as possible. Then, when it is determined that the actual values are sufficiently small, the correction value calculator 905 notifies a new recipe generator 906 of the correction values of the outputs of the plasma sources #1 to #7 (the total value of the correction values for multiple times when calculation is performed multiple times).

Further, the correction value calculator 905 calculates, as a predicted film thickness, the calculated film thickness at each position of the wafer when the film forming processing is performed under the new process conditions based on:

the initial film thickness;

the film thickness model $M_T$; 810; and the correction values of the outputs of the plasma sources #1 to #7 (the total value of the correction values for multiple times when calculation is performed multiple times), and displays the predicted film thickness to the operator 70.

Further, the correction value calculator 905 calculates, as a predicted refractive index, the calculated refractive index at each position of the wafer when the film forming processing is performed under the new process conditions based on:

the initial refractive index;

the refractive index model $M_R$; 820; and the correction values of the outputs of the plasma sources #1 to #7 (the total value of the correction values for multiple times when calculation is performed multiple times), and displays the predicted refractive index to the operator 70.

The recipe generator 152 includes the new recipe generator 906. The new recipe generator 906 accepts the input of the current recipe from the operator 170. Further, the new recipe generator 906 modifies the current recipe and generates a new recipe by using the correction values of the outputs of the plasma sources #1 to #7 (the total value of the correction values for multiple times when calculation is performed multiple times) notified from the correction value calculator 905. Moreover, the new recipe generator 906 displays the generated new recipe to the operator 170 and notifies the film forming device 110 of the generated new recipe.

<Details of Processing in Optimizer>

Next, the details of a processing in the optimizer 151 (mainly the details of a processing in the Kalman filter unit 904) will be described using mathematical formulas. In addition, here, for simplicity of description, a case where the input of a target film thickness is accepted as a target value for new recipe generation will be described (a case where the input of a target refractive index is accepted is similarly to the case where the input of the target film thickness is accepted and thus, a description thereof will be omitted).

Figure 10A:
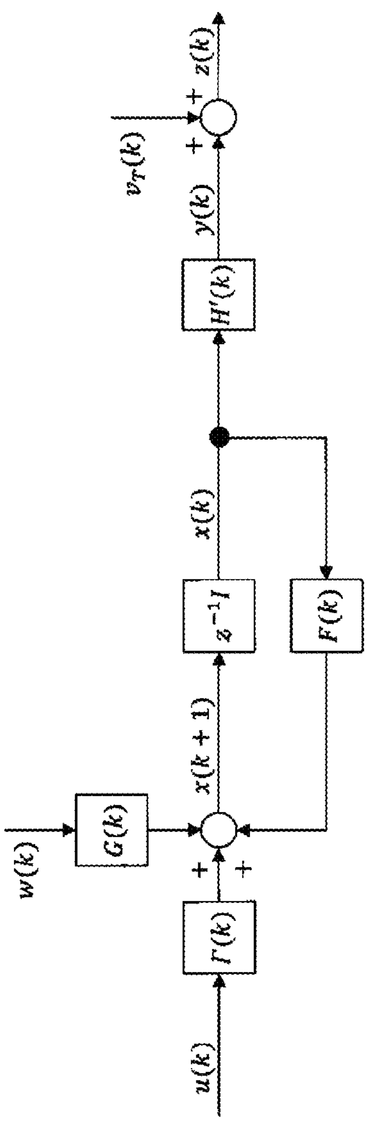
FIGS. 10A and 10B are diagrams for explaining a processing in the optimizer in detail.
Figure 10B:
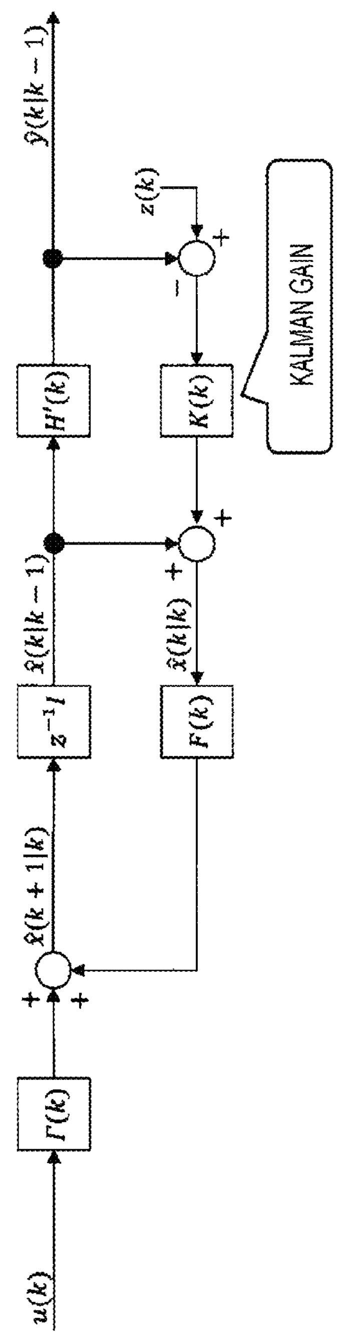

FIGS. 10A and 10B are diagrams for explaining the details of the processing in the optimizer. Of these, FIG. 10A is a diagram schematically illustrating an input/output relationship between:

the correction value of the output of the plasma source calculated by the correction value calculator 905 of the optimizer 151; and the film thickness residual calculated by the residual calculator 903 of the optimizer 151.

In addition, the meanings of respective symbols illustrated in FIG. 10A are as follows:

k: time step (the number of times the correction value of the output of the plasma source is notified to the film forming device 110);

u (k): the correction value of the output of the plasma source;

w (k): system noise;

x(k+1): the state of the film forming device 110 after the change caused when the $k^{th}$ correction value is notified;

x(k): the state of the film forming device 110 before the $k^{th}$ correction value is notified;

y(k): the actual value of the film thickness residual (the current film thickness−the target film thickness) before the $k^{th}$ correction value is notified;

$v_T$: the measurement error related to the film thickness; and z(k): the film thickness residual calculated based on the current film thickness before the $k^{th}$ correction value is notified.

In the Kalman filter unit 904 of the optimizer 151, a Kalman filter is configured based on the input/output relationship between:

the correction value of the output of the plasma source calculated by the correction value calculator 905 of the optimizer 151; and the film thickness residual calculated by the residual calculator 903 of the optimizer 151, and adjusts the Kalman gain (see FIG. 10B).

In addition, FIG. 10B is an example of the Kalman filter configured in the Kalman filter unit 904 based on the input/output relationship illustrated in FIG. 10A.

The Kalman filter unit 904 of the optimizer 151 estimates the actual value of the film thickness residual by acquiring the film thickness residual from the residual calculator 903 and adjusting the Kalman gain whenever the correction value calculator 905 notifies the correction value of the output of the plasma source.

In addition, in the respective symbols illustrated in FIG. 10B, for example, there is Equation 1 of $\hat{x}(k+1/k)$.

Equation 1 indicates the state (state estimated by the Kalman filter) of the film forming device 110 after the change caused when the $k^{th}$ correction value is notified.

Similarly, for example, there is Equation 2 of $\hat{y}(k+1/k)$.

Equation 2 indicates the actual value of the film thickness residual (value estimated by the Kalman filter) when the $k-1^{st}$ correction value is notified and the film forming processing is performed (before the $k^{th}$ correction value is notified).

<Flow of New Recipe Generation Processing>

Figure 11A:
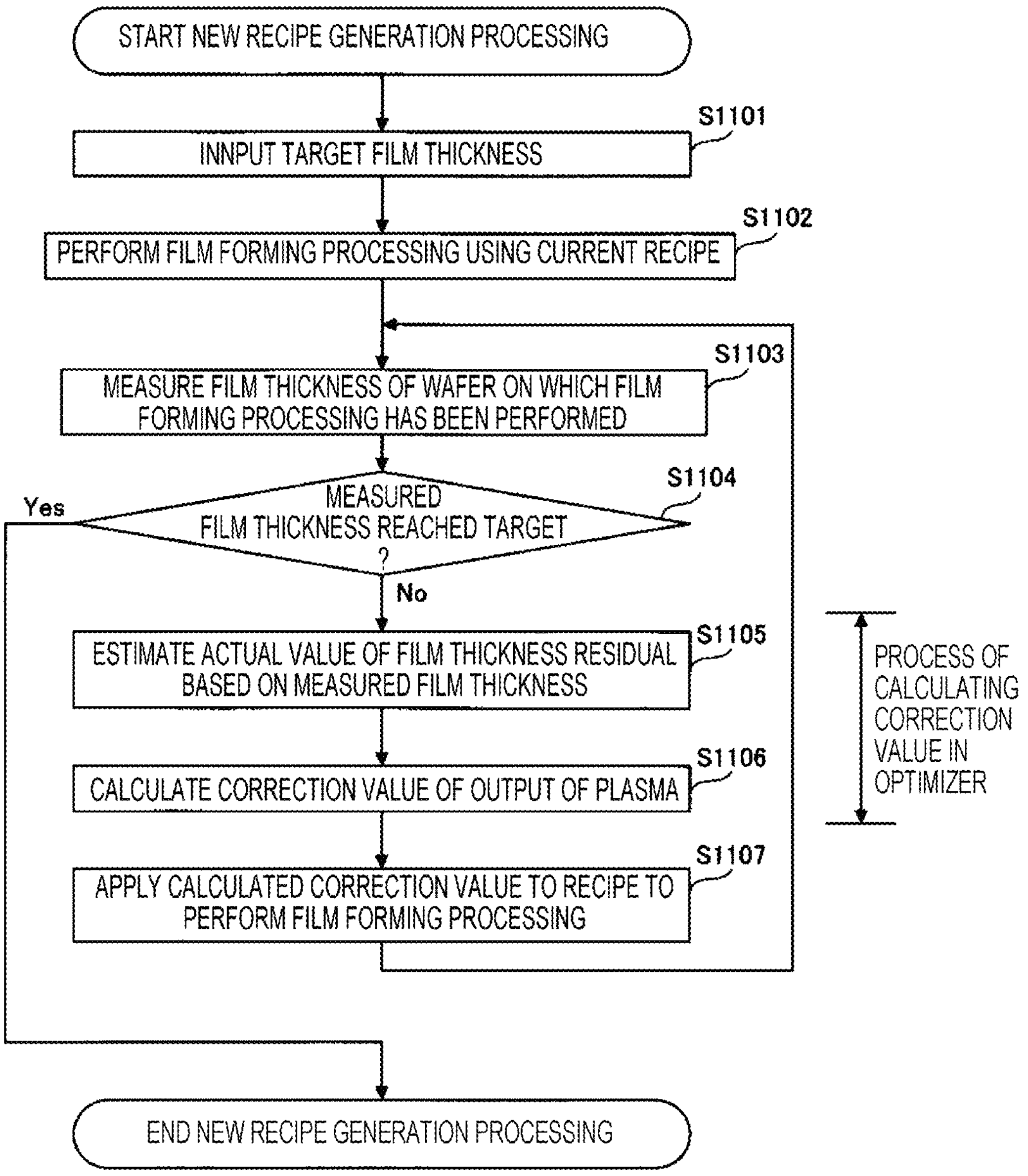
FIG. 11A is a flowchart illustrating a flow of a new recipe generation processing.

Next, a flow of a new recipe generation processing will be described. FIG. 11A is a flowchart illustrating a flow of a new recipe generation processing.

In step S1101, the target value input unit 902 receives the input of a target film thickness from the operator 170.

In step S1102, the film forming device 110 performs a film forming processing using a current recipe.

In step S1103, the film thickness measuring device 120 measures the film thickness at each position of the wafer on which the film forming processing has been performed in step S1102.

In step S1104, the measurement value acquirer 901 acquires the film thickness at each position of the wafer measured in step S1103 as an initial film thickness. Further, the residual calculator 903 determines whether or not the acquired initial film thickness matches the target film thickness.

When it is determined in step S1104 that they match (if Yes in step S1104), the new recipe generation processing ends. On the other hand, when it is determined in step S1104 that they do not match (if No in step S1104), the processing proceeds to step S1105. After that, in steps S1105 and S1106, the optimizer 151 executes a process of calculating the correction value of the output of each of the plasma sources #1 to #7.

In step S1105, the residual calculator 903 calculates a film thickness residual based on the difference between the initial film thickness and the target film thickness. Further, the Kalman filter unit 904 estimates the actual value of the film thickness residual by adjusting the Kalman gain.

In step S1106, the correction value calculator 905 calculates the correction value of the output of each of the plasma sources #1 to #7 based on the actual value of the film thickness residual and the film thickness model $M_T$. Further, the correction value calculator 905 notifies the film forming device 110 of new process conditions to which the calculated correction value of the output of each of the plasma sources #1 to #7 (the total value of the correction values for multiple times when calculation is performed multiple times) is applied.

In step S1107, the film forming device 110 performs a film forming processing under the notified new processing conditions, and returns to step S1103. After that, the processing of steps S1103 to S1107 is repeated until it is determined in step S1104 that the current film thickness measured in step S1103 matches the target film thickness. Then, when it is determined in step S1104 that the current film thickness matches the target film thickness (if Yes in step S1104), the new recipe generation processing ends.

In addition, although the flow of the new recipe generation processing is illustrated in FIG. 11A, a flow of a recipe adjustment processing is also the same.

Figure 11B:
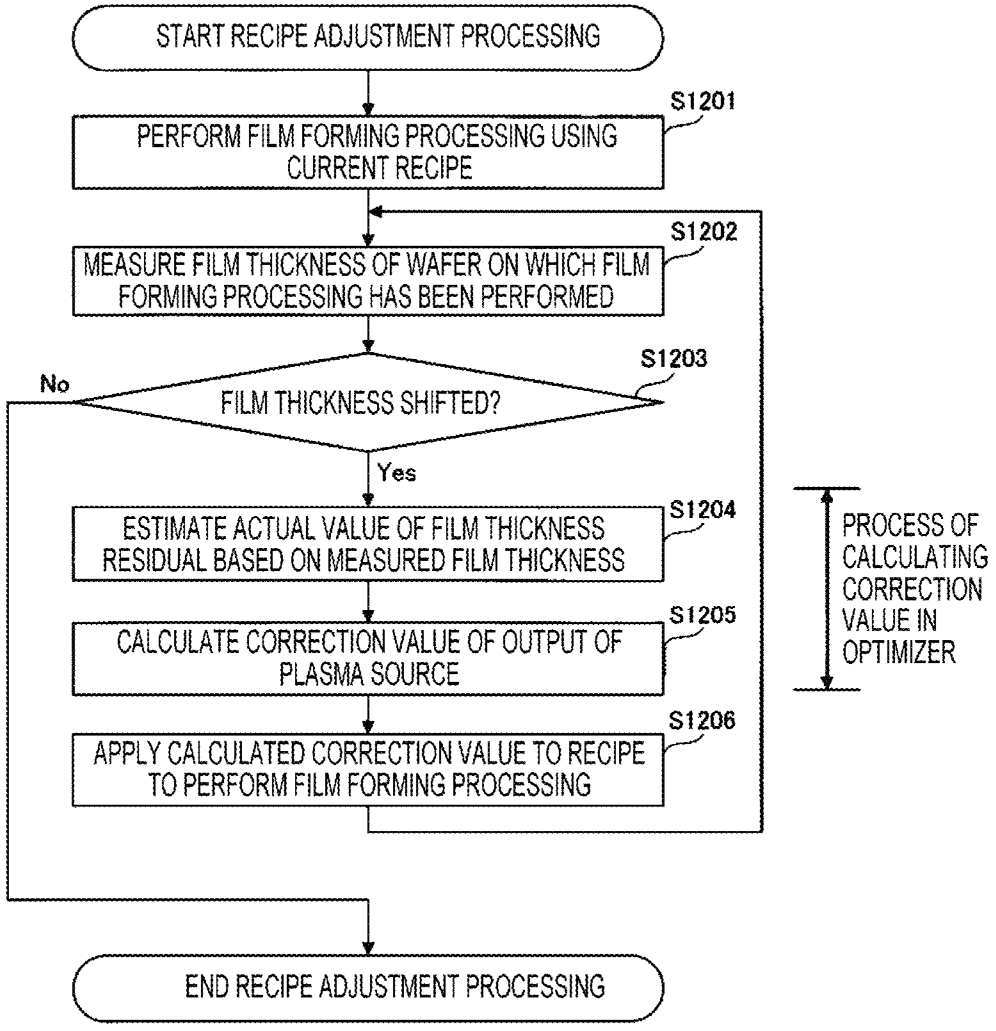
FIG. 11B is a flowchart illustrating a flow of a recipe adjustment processing.

FIG. 11B is a flowchart illustrating a flow of a recipe adjustment processing, and illustrates a flow of a processing at the time of "Run to Run". In addition, since the processing content illustrated in FIG. 11B is substantially the same as the processing content illustrated in FIG. 11A, a detailed description thereof will be omitted here.

<Specific Example of New Recipe Generation Processing>

Figure 12:
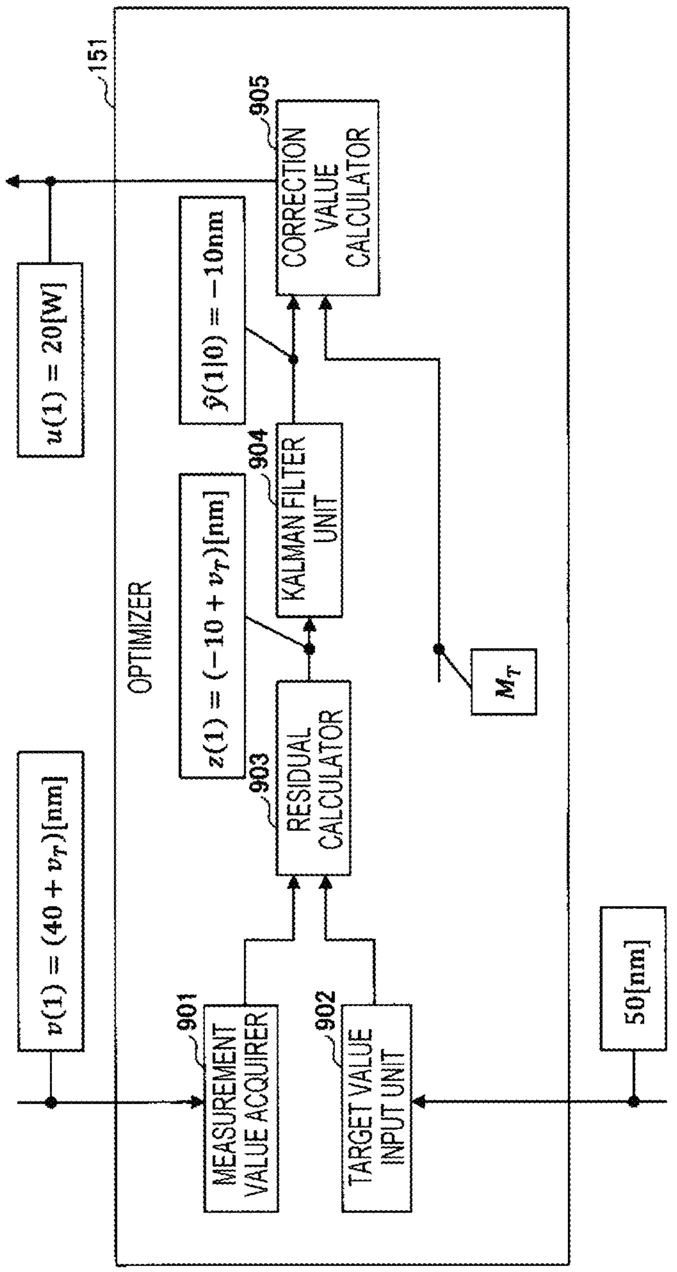
FIG. 12 is a first diagram illustrating a specific example of a processing performed by the optimizer in the new recipe generation processing.

Next, a specific example of a processing performed by the optimizer 151 in a new recipe generation processing will be described. FIG. 12 is a first diagram illustrating a specific example of a processing performed by the optimizer in a new recipe generation processing.

The example of FIG. 12 illustrates a state where a film forming processing is performed based on a current recipe, such that the measurement value acquirer 901 receives $v(1)=(40+v_T)$ [nm] from the film thickness measuring device 120 as an initial film thickness.

Further, the example of FIG. 12 illustrates a state where the target value input unit 902 receives the input of the target film thickness=50 [nm] as a target film thickness by the operator 170.

Further, the example of FIG. 12 illustrates a state where the residual calculator 903 calculates the difference between the initial film thickness and the target film thickness, such that $z(1)=(-10+v_T)$ [nm] is calculated as a film thickness residual.

Further, the example of FIG. 12 illustrates a state where the Kalman filter unit 904 estimates −10 nm as the actual value of the film thickness residual based on the film thickness residual.

Further, the example of FIG. 12 illustrates a state where the correction value calculator 905 calculates the correction value of the output of each plasma source based on the film thickness model $M_T$ and the film thickness residual such that the actual value (=−10 nm) of the film thickness residual is as small as possible to output u(1)=20 W.

Figure 13:
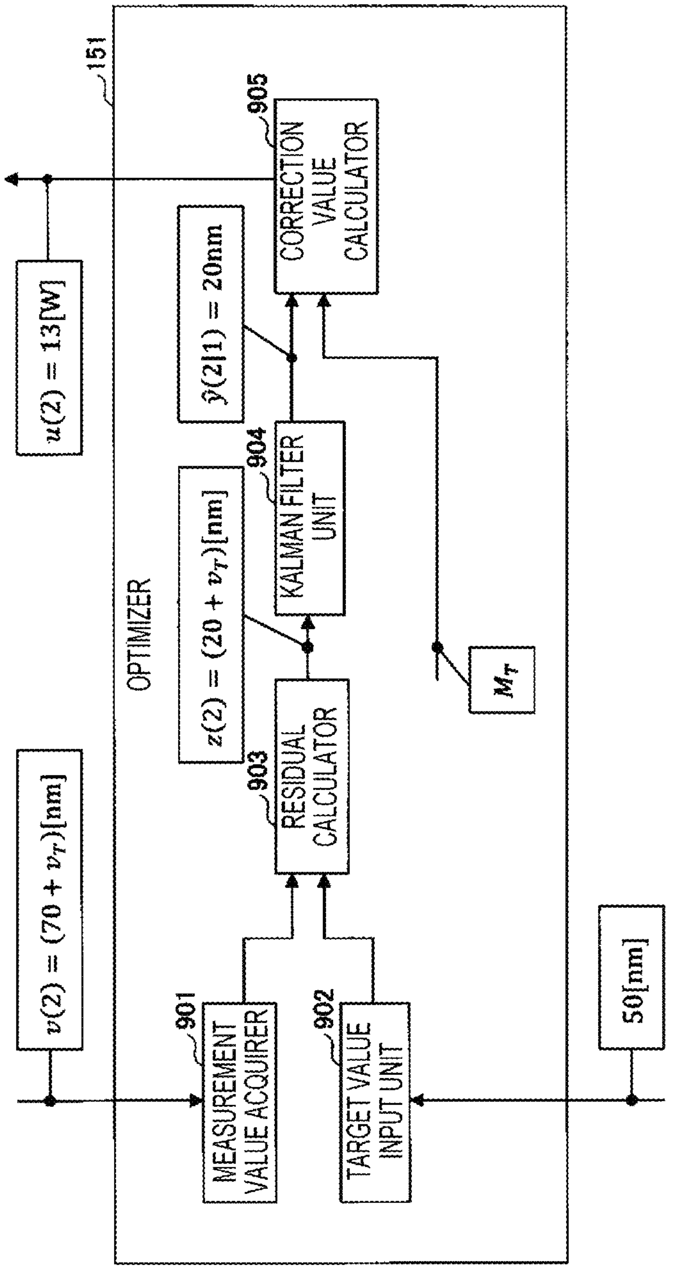
FIG. 13 is a second diagram illustrating the specific example of the processing performed by the optimizer in the new recipe generation processing.

FIG. 13 is a second diagram illustrating the specific example of the processing performed by the optimizer in the new recipe generation processing. The example of FIG. 13 illustrates a processing by the optimizer 151 after the film forming processing is performed under new process conditions to which the correction value (u(1)=20 W) of the output of each plasma source calculated in FIG. 12 is applied. Specifically, FIG. 13 illustrates a state where the measurement value acquirer 901 acquires $v(2)=(70+v_T)$ [nm] as a current film thickness from the film thickness measuring device 120.

Further, the example of FIG. 13 illustrates a state where the residual calculator 903 calculates $v(2)=(20+v_T)$ [nm] as a film thickness residual by calculating the difference between the current film thickness and the target film thickness.

Further, the example of FIG. 13 illustrates a state where the Kalman filter unit 904 estimates 20 nm as the actual value of the film thickness residual based on the film thickness residual.

Further, the example of FIG. 13 illustrates a state where the correction value calculator 905 calculates the correction value of the output of each plasma source based on the film thickness model $M_T$ and the film thickness residual such that the actual value (=20 nm) of the film thickness residual is as small as possible to output u(2)=13 W.

Figure 14:
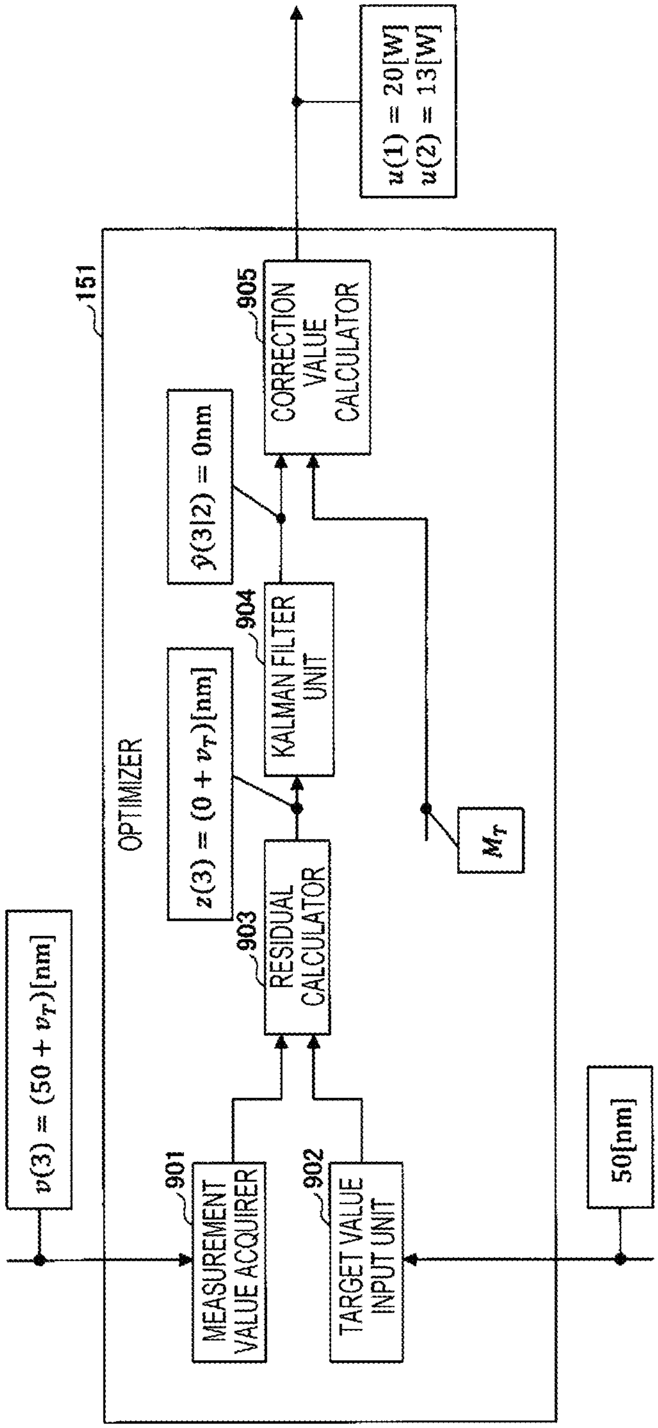
FIG. 14 is a third diagram illustrating the specific example of the processing performed by the optimizer in the new recipe generation processing.

FIG. 14 is a third diagram illustrating the specific example of the new recipe generation processing. The example of FIG. 14 illustrates the processing by the optimizer 151 after the film forming processing is performed under the new process conditions to which the correction value (u(2)=13 W) of the output of each plasma source calculated in FIG. 13 is applied. Specifically, FIG. 14 illustrates a state where the measurement value acquirer 901 acquires $v(3)=(50+v_T)$ [nm] as the current film thickness from the film thickness measuring device 120.

Further, the example of FIG. 14 illustrates a state where the residual calculator 903 calculates $z(3)=(0+v_T)$ [nm] as the film thickness residual by calculating the difference between the current film thickness and the target film thickness.

Further, the example of FIG. 14 illustrates a state where the Kalman filter unit 904 estimates 0 nm as the actual value of the film thickness residual based on the film thickness residual.

Further, the example of FIG. 14 illustrates a state where it is determined that the actual value of the film thickness residual is sufficiently small because the actual value of the film thickness residual becomes 0 nm.

Further, the example of FIG. 14 illustrates a state where the correction value calculator 905 notifies the new recipe generator 906 of the correction value of the output of each plasma source (e.g., the correction value u(1)=20 W, u(2)=13 W) of the output of the plasma source #1 for multiple times).

In this way, when generating a new recipe to achieve a desired film thickness in the film forming device 110, the optimizer 151 of the information processing device 140 automatically calculates the correction value of the output of each plasma source. Thus, the operator 170 may optimize the output of each plasma source by simply performing the film forming processing according to new process conditions to which the correction value calculated by the optimizer 151 is applied. That is, according to the information processing device 140, it is possible to optimize the outputs of a plurality of plasma sources without depending on the know-how of the operator 170.

<Film Forming Processing According to New Recipe>

Figure 15B:
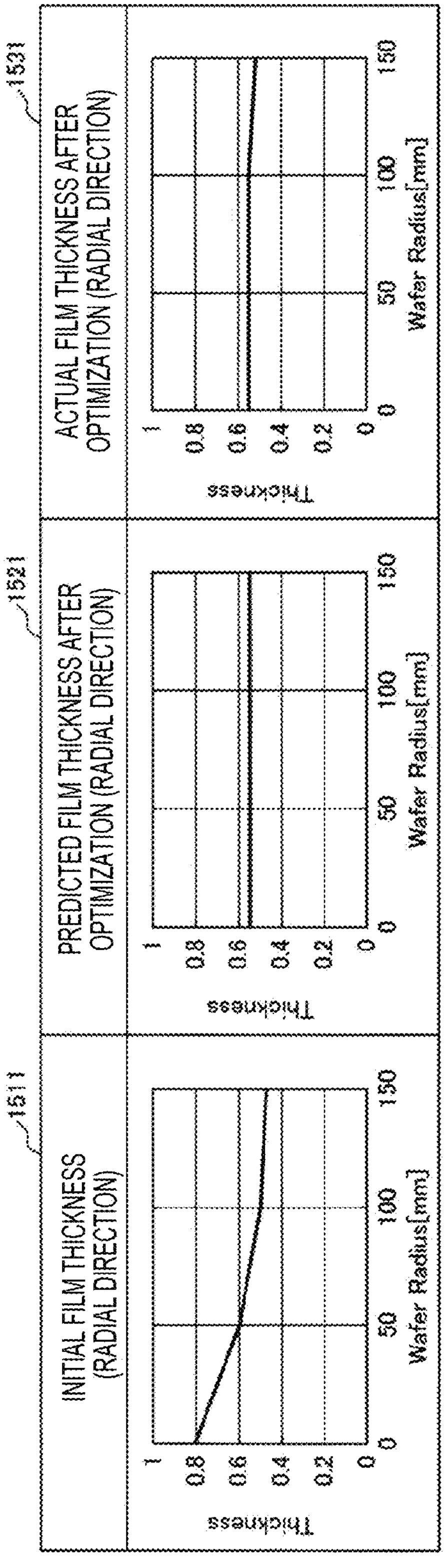

Next, a film forming processing according to a new recipe will be described. FIGS. 15A and 15B are a first diagram illustrating the result of a film forming processing according to a new recipe. In FIGS. 15A and 15B, among process conditions 1500, process data at the upper end indicates process data included in a current recipe, and process data at the lower end indicates process data included in a new recipe.

Further, in FIGS. 15A and 15B, reference numeral 1510 visualizes, as a color map, the film thickness distribution (i.e., initial film thickness distribution) at each position of the wafer when a film forming processing is performed using a current recipe. Further, reference numeral 1511 indicates the average value of the initial film thickness in each radial direction.

Meanwhile, reference numeral 1520 visualizes, as a color map, the predicted film thickness distribution at each position of the wafer when a film forming processing is performed using a new recipe. Further, reference numeral 1521 indicates the average value of the predicted film thickness in each radial direction.

Further, reference numeral 1530 visualizes, as a color map, the actual film thickness distribution at each position of the wafer when the film forming processing is performed using the new recipe. Further, reference numeral 1531 indicates the average value of the actual film thickness in each radial direction.

As is clear from the comparison between reference numeral 1511 and reference numerals 1521 and 1531, in a case of reference numeral 1511, change in the film thickness in the radial direction is large. Meanwhile, in a case of reference numerals 1521 and 1531, change in the film thickness in the radial direction is small.

In this way, by using the new recipe optimized based on the film thickness model generated for each plasma source, it is possible to improve the uniformity of the film thickness related to the surface shape among the surface states of the wafer.

Further, as is clear from the comparison between reference numeral 1521 and reference numeral 1531, the average value of the predicted film thickness at each position of the wafer is substantially the same as the average value of the measured value of the film thickness at each position of the wafer when the film forming processing is performed using the new recipe. That is, according to the information processing device 140, it is possible to accurately calculate the predicted film thickness.

<Summary>

As is clear from the above description, the information processing device 140 according to the first embodiment performs a process including:

- acquiring the amount of change in the film thickness or the refractive index at each position of a wafer when a film forming processing is performed by changing the output of each of a plurality of plasma sources provided in a film forming device by a predetermined amount;
- generating a film thickness model or a refractive index model by calculating the amount of change in the film thickness or the refractive index at each position of the wafer with respect to the amount of change when the output of each plasma source is changed; and
- calculating the correction value of the output of each of the plurality of plasma sources for achieving a target film thickness or a target refractive index based on the generated film thickness model or refractive index model.

Thus, the operator may optimize the output of each plasma source by performing a film forming processing according to new process conditions to which the calculated correction value is applied.

As described above, according to the information processing device 140 of the first embodiment, it is possible to support an operation of optimizing the outputs of a plurality of plasma sources.

Second Embodiment

In the first embodiment, the correction value calculator 905 has been described as calculating the correction value of the output of each plasma source so that the actual value of the film thickness residual is as small as possible by using the film thickness model. However, the method of calculating the correction value of the output of each plasma source is not limited to this.

For example, calculation may be performed by a quadratic programming method in which the objective function is the square of a function including the film thickness model, the correction value of the output of each plasma source, and the actual value of the film thickness residual, and the upper and lower limits of the correction value of the output of each plasma source are limiting conditions. Thus, according to the second embodiment, the correction value of the output of each plasma source may be calculated so that the actual value of the film thickness residual is as small as possible within the range of the upper and lower limits.

Third Embodiment

In the first embodiment, the film thickness model and the refractive index model have been described as being generated by changing the output of each plasma source by a predetermined amount. However, the method of generating the film thickness model and the refractive index model is not limited to this, and for example, the film thickness model and the refractive index model may be generated by changing the flow rate of a plasma gas by a predetermined amount. Thus, the flow rate of the plasma gas may be optimized.

In this way, by optimizing the flow rate of the plasma gas in addition to the output of each plasma source, it is possible to further improve the uniformity of the refractive index as compared with a case of optimizing only the output of each plasma source.

In addition, in the present embodiment, the optimizer 151 optimizes the output of each plasma source and the flow rate of the plasma gas in each gas flow path using two types of film thickness models including:

- a film thickness model (first film thickness model) generated by changing the output of each plasma source by a predetermined amount; and
- a film thickness model (second film thickness model) generated by changing the flow rate of the plasma gas in each gas flow path by a predetermined amount.

Similarly, in the present embodiment, the optimizer 151 optimizes the output of each plasma source and the flow rate of the plasma gas in each gas flow path using two types of refractive index models including:

- a refractive index model (first refractive index model) generated by changing the output of each plasma source by a predetermined amount; and a refractive index model (second refractive index model) generated by changing the flow rate of the plasma gas in each gas flow path by a predetermined amount.

Alternatively, the optimizer 151 may optimize the output of each plasma source and the flow rate of the plasma gas in each gas flow path using:

a film thickness model generated by changing the output of each plasma source by a predetermined amount; and a refractive index model generated by changing the flow rate of the plasma gas in each gas flow path by a predetermined amount.

Fourth Embodiment

In the first embodiment, the Kalman filter unit 904 has been described as estimating the actual values of the film thickness residual and the refractive index residual by adjusting the Kalman gain. However, the method for estimating the actual values is not limited to this, and may be configured to estimate the actual values using other learning functions.

Fifth Embodiment

In the first embodiment, among the process conditions 700, the process conditions other than the output of each plasma source have been described as being fixed. However, the process conditions other than the output of each plasma source may also be optimization targets with regard to, for example, the film forming time or the Atomic Layer Deposition (ALD) cycle. This is because the optimizer 151 may calculate the predicted film thickness or the predicted refractive index according to the optimized film forming time by calculating a film forming rate in advance based on a relationship between the film forming time and the amount of change in the film thickness when a film forming processing is performed according to a current recipe.

Further, in the first embodiment, the information processing program has been described as being stored in the auxiliary memory 404 of the information processing device 140. However, the information processing program may be incorporated into, for example, a memory included in the controller 380 in the film forming device 110, which is an example of a semiconductor manufacturing device.

According to the present disclosure, it is possible to provide an information processing device, an information processing method, an information processing program, and a semiconductor manufacturing device which support an operation of optimizing the outputs of a plurality of plasma sources.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the actual scope and spirit being indicated by the following claims.

What is claimed is:

1. An information processing device comprising:

a storage configured to store a first film thickness model that defines an amount of change in a film thickness at each position of a first wafer and a first refractive index model that defines a refractive index at each position of the first wafer, when a film forming processing is performed by changing an output of each of a plurality of plasma sources provided in a film forming device by a predetermined amount; and a calculator configured to:

calculate a film thickness residual or a refractive index residual that is a difference between the film thickness or the refractive index at each position of a second wafer and a target value of the film thickness or a target value of the refractive index at each position of the second wafer;

calculate a correction value of the output of each of the plurality of plasma sources based on the film thickness residual or the refractive index residual and the first film thickness model or the first refractive index model; and calculate the correction value, as a final correction value, such that the film thickness residual or the refractive index residual is below a predetermined value when the film forming processing is performed using the correction value.

2. The information processing device according to claim 1, wherein the calculator estimates an actual value of the film thickness residual or the refractive index residual using a learning function, and calculates the correction value of the output of each of the plurality of plasma sources based on the estimated actual value of the film thickness residual or the refractive index residual.

3. The information processing device according to claim 1, wherein the calculator calculates a predicted film thickness or a predicted refractive index at each position of the second wafer when the film forming processing is performed under a process condition to which the final correction value of the output of each of the plurality of plasma sources is applied, based on an initial film thickness or an initial refractive index at each position of the second wafer, the first film thickness model or the first refractive index model, and the final correction value of the output of each plasma source.

4. The information processing device according to claim 3, wherein the calculator visualizes the predicted film thickness or the predicted refractive index at each position of the second wafer by a color map.

5. The information processing device according to claim 1, further comprising:

a generator configured to generate a new recipe by applying the final correction value of the output of each of the plurality of plasma sources calculated by the calculator to a predetermined process condition included in a current recipe used when the film forming processing is performed on the second wafer.

6. The information processing device according to claim 1, wherein the storage stores the first film thickness model and the first refractive index model according to a number of plasma sources.

7. The information processing device according to claim 1, wherein the storage further stores a second film thickness model that defines an amount of change in the film thickness at each position of the first wafer and a second refractive index model that defines the refractive index at each position of the first wafer when the film forming processing is performed by changing a flow rate of a plasma gas in each gas flow path of the film forming device by a predetermined amount, and the calculator calculates, based on first film thickness model or the first refractive index model and the second film thickness model or the second refractive index model, the correction value of the output of each of the plurality of plasma sources and a correction value of the flow rate of the plasma gas in each gas flow path to achieve the target value of the film thickness or the target value of the refractive index at each position of the second wafer.

8. The information processing device according to claim 7, wherein the storage stores the second film thickness model and the second refractive index model according to a number of gas flow paths.

9. An information processing method comprising:

generating a film thickness model defining an amount of change in a film thickness at each position of a first wafer and a refractive index model defining a refractive index at each position of the first wafer when a film forming processing is performed by changing an output of each of a plurality of plasma sources provided in a film forming device by a predetermined amount;

calculating a film thickness residual or a refractive index residual that is a difference between the film thickness or the refractive index at each position of a second wafer and a target value of the film thickness or a target value of the refractive index at each position of the second wafer;

calculating a correction value of the output of each of the plurality of plasma sources based on the film thickness residual or the refractive index residual and the film thickness model or the refractive index model; and calculating the correction value, as a final correction value, such that the film thickness residual or the refractive index residual is below a predetermined value when the film forming processing is performed using the correction value.

10. A non-transitory computer-readable storage medium having stored therein a program that causes a computer to execute an information processing comprising:

generating a film thickness model defining an amount of change in a film thickness at each position of a first wafer and a refractive index model defining a refractive index at each position of the first wafer, when a film forming processing is performed by changing an output of each of a plurality of plasma sources provided in a film forming device by a predetermined amount;

calculating a film thickness residual or a refractive index residual that is a difference between the film thickness or the refractive index at each position of a second wafer and a target value of the film thickness or a target value of the refractive index at each position of the second wafer;

calculating a correction value of the output of each of the plurality of plasma sources based on the film thickness residual or the refractive index residual and the film thickness model or the refractive index model; and calculating the correction value, as a final correction value, such that the film thickness residual or the refractive index residual is below a predetermined value when the film forming processing is performed using the correction value.

* * * * *